(12) United States Patent
Nagai et al.

(10) Patent No.: US 11,548,829 B2
(45) Date of Patent: Jan. 10, 2023

(54) DENSE COMPOSITE MATERIAL, METHOD FOR PRODUCING THE SAME, JOINED BODY, AND MEMBER FOR SEMICONDUCTOR MANUFACTURING DEVICE

(71) Applicant: NGK INSULATORS, LTD., Nagoya (JP)

(72) Inventors: Asumi Nagai, Okazaki (JP); Noboru Nishimura, Nagoya (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 23 days.

(21) Appl. No.: 17/153,001

(22) Filed: Jan. 20, 2021

(65) Prior Publication Data

US 2021/0230074 A1 Jul. 29, 2021

(30) Foreign Application Priority Data

Jan. 29, 2020 (JP) .............................. JP2020-012343

(51) Int. Cl.
| | | |
|---|---|---|
| *C04B 35/58* | (2006.01) | |
| *C04B 35/575* | (2006.01) | |
| *C04B 35/56* | (2006.01) | |
| *H01L 21/683* | (2006.01) | |
| *C04B 35/645* | (2006.01) | |
| *C04B 37/00* | (2006.01) | |

(52) U.S. Cl.
CPC ...... *C04B 35/58092* (2013.01); *C04B 35/575* (2013.01); *C04B 35/645* (2013.01); *C04B 37/00* (2013.01); *H01L 21/6833* (2013.01); *C04B 2235/3826* (2013.01); *C04B 2235/3843* (2013.01); *C04B 2235/3891* (2013.01); *C04B 2235/5436* (2013.01); *C04B 2235/66* (2013.01); *C04B 2235/9607* (2013.01)

(58) Field of Classification Search
CPC ............ C04B 35/58092; C04B 35/565; C04B 35/575; C04B 35/5611
See application file for complete search history.

(56) References Cited

U.S. PATENT DOCUMENTS

| | | | |
|---|---|---|---|
| 9,184,070 B2* | 11/2015 | Jindo | ..................... C04B 35/575 |
| 9,188,397 B2* | 11/2015 | Jindo | .................. C04B 35/5615 |
| 11,205,584 B2* | 12/2021 | Takebayashi | ......... C04B 35/565 |

(Continued)

FOREIGN PATENT DOCUMENTS

| | | |
|---|---|---|
| CN | 104045347 A | 9/2014 |
| JP | 6182082 B2 | 8/2017 |

OTHER PUBLICATIONS

Chinese Office Action, Chinese Application No. 202110081654.1, dated Dec. 1, 2022 (7 pages).

*Primary Examiner* — Karl E Group
(74) *Attorney, Agent, or Firm* — Burr & Brown, PLLC

(57) ABSTRACT

According to the present invention, a dense composite material includes titanium silicide in an amount of 43 to 63 mass %; silicon carbide in an amount less than the mass percentage of the titanium silicide; and titanium carbide in an amount less than the mass percentage of the titanium silicide. In the dense composite material, a maximum value of interparticle distances of the silicon carbide is 40 μm or less, a standard deviation of the interparticle distances is 10 or less, and an open porosity of the dense composite material is 1% or less.

12 Claims, 1 Drawing Sheet

Example 1

(56) References Cited

U.S. PATENT DOCUMENTS

| | | | |
|---|---|---|---|
| 2014/0272378 A1* | 9/2014 | Jindo | C04B 35/645 428/312.6 |
| 2014/0287245 A1* | 9/2014 | Jindo | H01L 21/67109 428/446 |
| 2018/0108556 A1* | 4/2018 | Takebayashi | B32B 38/1866 |

* cited by examiner

Example 1

Example 5

Example 9

Example 2

Example 6

Example 10

Example 3

Example 7

Example 11

Example 4

Example 8

DENSE COMPOSITE MATERIAL, METHOD FOR PRODUCING THE SAME, JOINED BODY, AND MEMBER FOR SEMICONDUCTOR MANUFACTURING DEVICE

BACKGROUND OF THE INVENTION

1. Field of the Invention

The present invention relates to a dense composite material, a method for producing the same, a joined body, and a member for semiconductor manufacturing device.

2. Description of the Related Art

Electrostatic chucks become hot in a semiconductor process, and, therefore, electrostatic chucks are provided with a cooling plate joined thereto for heat dissipation. In such cases, a material of an electrostatic chuck may be alumina, a material of a cooling plate may be aluminum, and a bonding material may be a resin. Alumina and aluminum have significantly different coefficients of linear thermal expansion. For example, alumina has a coefficient of linear thermal expansion of 7.9 ppm/K (RT to 800° C., Seramikku no Butsuri (Physics of Ceramics), Uchida Rokakuho Publishing Co., Ltd.), and aluminum has a coefficient of linear thermal expansion of 31.1 ppm/K (RT to 800° C., Shinpen netsubussei handobukku (Thermophysical Property Handbook New Edition), edited by Japan Society of Thermophysical Properties). In a case where a cooling plate is to be joined to an electrostatic chuck, properties required of the cooling plate include, for example, a coefficient of linear thermal expansion close to that of the electrostatic chuck, a high thermal conductivity for maintaining heat dissipation properties, a high packing density that enables passage of a cooling liquid or a cooling gas, and high strength for withstanding processing, installation, and the like. An example of a material that has such properties is a composite material disclosed in Patent Literature 1. The composite material is a material that includes silicon carbide particles in an amount of 37 to 60 mass % and includes titanium silicide, titanium silicon carbide, and titanium carbide, each in an amount less than the mass percentage of the silicon carbide particles. Furthermore, the composite material has an open porosity of 1% or less. The composite material has a coefficient of linear thermal expansion very close to that of alumina and has a sufficiently high thermal conductivity, packing density, and strength.

CITATION LIST

Patent Literature

[PTL 1] JP 6182082 B

SUMMARY OF THE INVENTION

However, in some cases, the composite material of Patent Literature 1 had sintering defect portions, depending on the lot. A reason for this is believed to be as follows. In the composite material of Patent Literature 1, the distribution of a titanium silicide phase, a titanium silicon carbide phase, and a titanium carbide phase corresponds to the disposition of titanium metal particles of the compact prior to firing. In a case where a large number of titanium metal particles having a large particle diameter are present, the disposition of the titanium metal particles becomes non-uniform, which results in formation of a segregated region including a titanium-containing phase and a silicon carbide particle. Presumably, as a result of this, the titanium components cannot sufficiently enter the gaps between the carbide particles, which leads to the formation of sintering defect portions (voids).

The present invention has been made to solve the above problem, and a principal object of the present invention is to provide a highly sintered material that has the characteristics of having a coefficient of linear thermal expansion very close to that of alumina and having a sufficiently high thermal conductivity, packing density, and strength.

A dense composite material according to the present invention includes titanium silicide in an amount of 43 to 63 mass %, silicon carbide in an amount less than the mass percentage of the titanium silicide, and titanium carbide in an amount less than the mass percentage of the titanium silicide, wherein a maximum value of interparticle distances of the silicon carbide is 40 μm or less, a standard deviation of the interparticle distances is 10 or less, and an open porosity of the dense composite material is 1% or less.

Note that in this specification, regarding the term "to" used to indicate a numerical range, it is intended that the values preceding and following the "to" are included in the range as the lower limit and the upper limit, respectively.

According to the present invention, a joined body is a joined body in which a first member and a second member are joined together, the first member including the dense composite material, the second member including alumina. According to the present invention, a member for a semiconductor manufacturing device is a member that uses the joined body.

According to the present invention, a method for producing a dense composite material includes the following steps: (a) preparing a powder mixture, the powder mixture including silicon carbide in an amount of 24 to 45 mass % and titanium silicide in an amount of 42 to 67 mass %, the silicon carbide having an average particle diameter of 10 to 25 μm, the titanium silicide having an average particle diameter of less than 10 μm, the powder mixture further including titanium metal having an average particle diameter of less than 20 μm or titanium carbide having an average particle diameter of less than 10 μm; and (b) sintering the powder mixture in a hot press at a temperature of 1350 to 1430° C. in an inert atmosphere.

ADVANTAGEOUS EFFECTS OF INVENTION

The dense composite material of the present invention is a highly sintered material that has the characteristics of having a coefficient of linear thermal expansion very close to that of alumina and having a sufficiently high thermal conductivity, packing density, and strength. Accordingly, the joined body in which a first member, which includes the dense composite material, and a second member, which includes alumina, are joined together can be used as a member for a semiconductor manufacturing device. Even in a case where the joined body is repeatedly used at low and high temperatures, the first member and the second member do not become separated from each other, and, therefore, the joined body has a long life while maintaining a high heat-dissipation ability. Furthermore, the method of the present invention for producing a dense composite material is suitable for producing the dense composite material described above.

DETAILED DESCRIPTION OF THE INVENTION

Figure 1A:
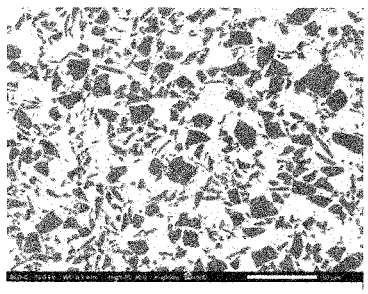
FIGS. 1A to 1K show SEM photographs of the composite materials of respective experimental examples.

According to an embodiment, a dense composite material includes titanium silicide in an amount of 43 to 63 mass %; silicon carbide in an amount less than the mass percentage of the titanium silicide; and titanium carbide in an amount less than the mass percentage of the titanium silicide. In the dense composite material, a maximum value of interparticle distances of the silicon carbide is 40 µm or less, a standard deviation of the interparticle distances is 10 or less, and an open porosity of the dense composite material is 1% or less.

The dense composite material of the embodiment includes titanium silicide in an amount of 43 to 63 mass %. The content is a value determined by Rietveld analysis. If titanium silicide is included in an amount less than 43 mass %, a sintering defect portion may be present, depending on the production lot. Accordingly, such an amount of titanium silicide is not preferable. Furthermore, if titanium silicide is included in an amount greater than 63 mass %, the dense composite material has an excessively high coefficient of thermal expansion, that is, a coefficient of thermal expansion significantly different from that of alumina, and as a result, a first member and a second member of a joined body may become separated from each other. Accordingly, such an amount of titanium silicide is not preferable. Examples of the titanium silicide include $TiSi_2$, TiSi, $Ti_5Si_4$, and $Ti_5Si_3$. Among these, $TiSi_2$ is preferable.

The dense composite material of the embodiment includes silicon carbide (SiC) and titanium carbide (TiC), each in an amount less than the mass percentage of the titanium silicide. It is preferable that the mass percentage of the silicon carbide be greater than the mass percentage of the titanium carbide. It is preferable that the silicon carbide be included in an amount of 29 to 46 mass %. It is preferable that the silicon carbide have an average particle diameter of 10 to 25 µm. It is preferable that the titanium carbide be included in an amount of 5 to 15 mass %.

In the dense composite material of the embodiment, a maximum value of interparticle distances of the silicon carbide is 40 µm or less, and a standard deviation of the interparticle distances of the silicon carbide is 10 or less. In cases where one or more of these conditions are not satisfied, the dense composite material may not have sufficiently high strength and/or may be insufficiently sintered. Accordingly, a failure to satisfy one or more of the conditions is not preferable. It is preferable that an average of the interparticle distances of the silicon carbide be 4 to 10 µm. The interparticle distance of the silicon carbide can be determined by analyzing an SEM image of the dense composite material.

The dense composite material of the embodiment has an open porosity of 1% or less. The value of the open porosity is a value measured by the Archimedes method by using purified water as a medium. It is preferable that the open porosity be less than or equal to 0.1%.

The dense composite material of the embodiment has a coefficient of linear thermal expansion substantially equal to that of alumina. As a result, in a case where a member made of the dense composite material of the embodiment and a member made of alumina are joined together (for example, by metallic bonding), the members do not easily become separated from each other even in a case where the joined body is repeatedly used at low and high temperatures. Specifically, preferably, an average coefficient of linear thermal expansion over a range of 40 to 570° C. of the dense composite material of the embodiment is different from that of alumina by the absolute value of 0.5 ppm/K or less, and more preferably, by the absolute value of 0.3 ppm/K or less. Furthermore, the average coefficient of linear thermal expansion over a range of 40 to 570° C. of the dense composite material of the embodiment is preferably 7.2 to 8.2 ppm/K and more preferably 7.4 to 8.0 ppm/K.

The dense composite material of the embodiment has excellent thermal conductivity. Specifically, it is preferable that the thermal conductivity be greater than or equal to 70 W/mK. Such a thermal conductivity enables, in a case where a member made of the dense composite material of the embodiment and a member made of alumina are joined together by metallic bonding, the heat possessed by the alumina to be released efficiently.

The dense composite material of the embodiment has excellent strength. Specifically, it is preferable that a four-point flexural strength of the dense composite material be greater than or equal to 250 MPa. Such a four-point flexural strength enables a member made of the dense composite material of the embodiment to be easily used in a cooling plate or the like.

The dense composite material of the embodiment may include titanium silicon carbide. In a case where titanium silicon carbide is included, a content of the titanium silicon carbide is preferably less than or equal to 10 mass % and more preferably 0.5 to 9 mass %. It is preferable that the titanium silicon carbide be $Ti_3SiC_2$ (TSC).

According to an embodiment, a joined body is a joined body formed of a first member and a second member that are joined together (for example, by metallic bonding). The first member is made of the dense composite material described above, and the second member is made of alumina. The joined body can be used, for example, in a member for a semiconductor manufacturing device. Examples of the member for a semiconductor manufacturing device include a member in which a cooling plate (a first member), which is made of the dense composite material described above, and an electrostatic chuck (a second member), which is made of alumina, are joined together with a bonding material primarily including aluminum or an alloy thereof. Since the first member has a coefficient of linear thermal expansion that is very close to that of alumina, the first member does not easily become separated from the second member even in a case where the member for a semiconductor manufacturing device is repeatedly used at low and high temperatures. Furthermore, since the first member has a sufficiently high thermal conductivity, the first member can efficiently cool the second member made of alumina. In addition, since the first member has a sufficiently high packing density, it is possible to pass a cooling liquid or a cooling gas through the interior of the first member; accordingly, cooling efficiency is further improved. In addition, since the first member has sufficiently high strength, the first member can sufficiently withstand the stress that is generated by a temperature difference that occurs when processing or joining for the production of the above-described member for a semiconductor manufacturing device is performed or when the member is used.

According to an embodiment, a method for producing a dense composite material includes the following steps: (a) preparing a powder mixture, the powder mixture including silicon carbide in an amount of 24 to 45 mass % and titanium silicide in an amount of 42 to 67 mass %, the silicon carbide having an average particle diameter of 10 to 25 μm, the titanium silicide having an average particle diameter of less than 10 μm, the powder mixture further including titanium metal having an average particle diameter of less than 20 μm or titanium carbide having an average particle diameter of less than 10 μm; and (b) sintering the powder mixture in a hot press at a temperature of 1350 to 1430° C. in an inert atmosphere.

For the preparation of the powder mixture in step (a), the average particle diameters of the respective components (silicon carbide, titanium silicide, titanium metal, and titanium carbide) are specified to be within the numerical ranges mentioned above, and the contents of the respective components are specified to be within the numerical ranges mentioned above. As a result, the dense composite material, which results from step (b), in which the powder mixture is sintered, is likely to be a highly sintered material that has the characteristics of having a coefficient of linear thermal expansion very close to that of alumina and having a sufficiently high thermal conductivity, packing density, and strength. This production method is suitable for producing the dense composite material of the embodiment.

In the step (a), it is preferable that a mass ratio Si/(Si+Ti) for Si and Ti derived from raw materials of the powder mixture excluding the silicon carbide be 0.40 to 0.50.

In the step (b), examples of the inert atmosphere include vacuum atmospheres, argon gas atmospheres, helium atmospheres, and nitrogen atmospheres. A press pressure for the firing in a hot press is not particularly limited, and preferably, the press pressure is specified to be 50 to 300 kgf/cm$^2$. Note that the firing time may be appropriately set in accordance with the firing condition, and, for example, a firing time of 1 to 10 hours may be appropriately set.

Note that it is apparent that the present invention is in no way limited to the embodiments described above, and the present invention can be carried out in a variety of ways within the technical scope of the present invention.

EXAMPLES

Suitable application examples of the present invention will be described below. The SiC raw material used was a commercially available product having a purity of 97% or greater and an average particle diameter of 15.5 μm. The elemental Ti raw material used was a powder having a purity of 99.5% or greater and an average particle diameter of 12.9 μm. The titanium disilicide used was a commercially available product having a purity of 99% or greater and an average particle diameter of 6.9 μm. The titanium carbide used was a commercially available product having a purity of 99% or greater and an average particle diameter of 4.3 μm. Note that the examples described below in no way limit the present invention.

Experimental Examples 1 to 11

1. Production Procedure

Blending

Each of the raw material components in a mass percentage as shown in Table 1 was weighed, and wet mixing was performed for 4 hours using a nylon pot and iron-core nylon balls having a diameter of 10 mm. Isopropyl alcohol was used as the solvent. After mixing, the slurry was removed and dried in a nitrogen stream at 110° C. Subsequently, the dried product was passed through a 30-mesh sieve to yield a blended powder. It was confirmed that in a case where approximately 500 g of weighed raw materials were loaded into a high-speed fluidizing mixer (which had a powder loading chamber capacity of 1.8 L) and mixed using an impeller, which was rotated at a rotational speed of 1500 rpm, material properties similar to those achieved in the wet mixing were achieved.

Compaction

The blended powder was uniaxially pressed at a pressure of 200 kgf/cm$^2$ to form a disc-shaped compact having a diameter of approximately 50 mm and a thickness of approximately 17 mm. The disc-shaped compact was placed in a graphite firing mold.

Firing

The disc-shaped compact was fired in a hot press to produce a dense sintered material. In the firing in the hot press, firing was performed at a press pressure of 200 kgf/cm$^2$ and the firing temperature (maximum temperature) shown in Table 1 in a vacuum atmosphere, which was maintained to the completion of firing. The holding time at the firing temperature was 4 hours.

2. Description of Table

Table 1 lists the following: a. a composition (blending ratio) of the starting material of each of the experimental examples; b. a mass ratio (Si/(Si+Ti)), which is the ratio of the mass of Si to the total mass of Si and Ti where Si and Ti are those derived from the components (Si, Ti, TiSi$_2$, and TiC) of the raw materials, excluding SiC; c. firing conditions (a hot press firing temperature and a press load); d. constituent phases of the composite material and mass ratios of the phases, determined by Rietveld analysis; and e. basic properties of the composite material (a bulk density, open porosity, four-point flexural strength, coefficient of linear thermal expansion, thermal conductivity, and parameters regarding the interparticle distance of silicon carbide). Note that of all of the Experimental Examples 1 to 11, Experimental Examples 1 to 9 are the examples of the present invention, and the remaining experimental examples are comparative examples.

TABLE 1

| | Examples | 1 | 2 | 3 | 4 | 5 | 6 |
|---|---|---|---|---|---|---|---|
| a. Material blending ratio mass % | SiC | 42.7 | 44.7 | 34.7 | 34.7 | 34.7 | 34.7 |
| | Si | — | — | — | — | — | — |
| | Ti | 14.8 | — | — | — | — | — |
| | TiSi$_2$ | 42.5 | 48.9 | 47.7 | 52.7 | 52.7 | 52.7 |
| | TiC | — | 6.4 | 17.6 | 12.6 | 12.6 | 12.6 |
| b. Si/(Si + Ti) of powder ✕Excluding SiC | | 0.400 | 0.488 | 0.417 | 0.453 | 0.453 | 0.453 |
| c. Firing condition | Firing temperature ° C. | 1400 | 1370 | 1370 | 1400 | 1350 | 1370 |
| | Load kgf/cm$^2$ | 200 | 200 | 200 | 200 | 200 | 200 |
| d. Constituent phases mass % | SiC | 39.1 | 45.9 | 40 | 39.3 | 40.4 | 38.8 |
| | TiSi$_2$ | 47.5 | 47.7 | 43.7 | 49.2 | 48.5 | 49.8 |
| | Ti$_3$SiC$_2$ | 5.7 | — | 3.4 | 0.7 | — | 1.1 |
| | TiC | 7.4 | 5.4 | 12.7 | 10.5 | 10.8 | 10.3 |

TABLE 1-continued

| e. Properties | Bulk density g/cm³ | 3.78 | 3.59 | 3.81 | 3.78 | 3.76 | 3.76 |
|---|---|---|---|---|---|---|---|
| | Open porosity % | 0.04 | 0.03 | 0.01 | 0 | 0.1 | 0.04 |
| | Four-point flexural strength Mpa | 336 | 361 | 288 | 301 | 275 | 334 |
| | Coefficient of thermal expansion ppm/K | 7.7 | 7.2 | 7.6 | 7.7 | 7.7 | 7.7 |
| | Thermal conductivity W/mK | 90 | 85 | 88 | 92 | 89 | 89 |
| | SiC interparticle distance average μm | 6.0 | 4.1 | 5.0 | 5.1 | 4.4 | 4.3 |
| | SiC interparticle distance Standard Deviation | 5.5 | 4.3 | 4.9 | 4.5 | 5.6 | 4.4 |
| | SiC interparticle distance Maximum Value μm | 27.5 | 26.7 | 26.5 | 28.8 | 25.3 | 22.4 |

| | | Examples | 7 | 8 | 9 | 10 | 11 |
|---|---|---|---|---|---|---|---|
| a. Material blending ratio mass % | SiC | | 34.6 | 24.7 | 24.7 | 42.7 | 42.7 |
| | Si | | — | — | — | 22.7 | 22.7 |
| | Ti | | — | — | — | 34.6 | 34.6 |
| | TiSi₂ | | 58.5 | 54.9 | 66.5 | — | — |
| | TiC | | 6.9 | 20.4 | 8.8 | — | — |
| b. Si/(Si + Ti) of powder ※Excluding SiC | | | 0.493 | 0.416 | 0.488 | 0.396 | 0.396 |
| c. Firing condition | Firing temperature ° C. | | 1430 | 1400 | 1430 | 1400 | 1370 |
| | Load kgf/cm² | | 200 | 200 | 200 | 200 | 200 |
| d. Constituent phases mass % | SiC | | 39.8 | 30.1 | 29.5 | 40.2 | 40.1 |
| | TiSi₂ | | 52.9 | 49.1 | 62.4 | 44 | 41.5 |
| | Ti₃SiC₂ | | — | 8.6 | — | 13.1 | 14.5 |
| | TiC | | 6.6 | 12.1 | 7.7 | 2.1 | 3.9 |
| e. Properties | Bulk density g/cm³ | | 3.74 | 3.92 | 3.85 | 3.78 | 3.58 |
| | Open porosity % | | 0.03 | 0.01 | 0.02 | 0.06 | 4.14 |
| | Four-point flexural strength Mpa | | 297 | 254 | 250 | 301 | 239 |
| | Coefficient of thermal expansion ppm/K | | 7.8 | 7.9 | 8.2 | 7.7 | 7.7 |
| | Thermal conductivity W/mK | | 90 | 77 | 71 | 91.7 | 80 |
| | SiC interparticle distance average μm | | 6.2 | 6.6 | 9.0 | 8.3 | 9.4 |
| | SiC interparticle distance Standard Deviation | | 6.1 | 6.6 | 7.6 | 11.6 | 17.3 |
| | SiC interparticle distance Maximum Value μm | | 27.9 | 34.7 | 36.3 | 59.9 | 95.7 |

3. Quantitative Determination of Constituent Phases

The dense composite material was ground in a mortar to form a powder, and the powder was measured by XRD over a range of 2θ=5° to 70°. The obtained XRD diffraction pattern was analyzed by Rietveld analysis. The analysis software used was TOPAS, manufactured by Bruker AXS.

4. Measurement of Basic Properties (1) Average Particle Diameters of Raw Materials A measurement was performed using an LA-950V2, manufactured by HORIBA, Ltd. Purified water was used as the dispersion medium.

(2) Open Porosity and Bulk Density

Measurements were performed using the Archimedes method, in which purified water was used as the medium.

(3) Four-Point Flexural Strength

A determination was performed in accordance with JIS-R1601.

(4) Coefficient of Linear Thermal Expansion (average coefficient of linear thermal expansion over a range of 40 to 570° C.)

A determination was performed in accordance with JIS-R1618. Specifically, by using a Thermo plus EVO (a vertical-type differential expansion measurement system), manufactured by Rigaku Corporation, the sample was heated to 600° C. under the condition of a heating rate of 10° C./min, in an argon atmosphere. This operation was performed twice. An average coefficient of linear thermal expansion over a range of 40 to 570° was calculated from the second measurement data. The standard sample used was an alumina standard sample (purity: 99.7%, bulk density: 3.9 g/cm³, length: 20 mm) that came with the system. The measurement value was 7.7 ppm/K, which was the value obtained by preparing another aliquot of the alumina standard sample and performing the measurement of the coefficient of linear thermal expansion under the same conditions.

(5) Thermal Conductivity

A measurement was performed using a laser flash method, in accordance with JIS-R1611.

(6) SEM Examination

Figure 1E:
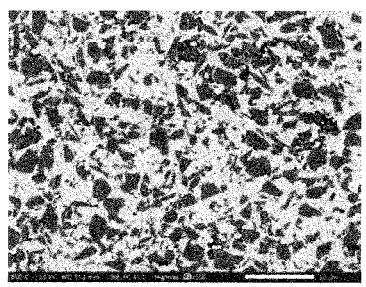
Figure 1I:
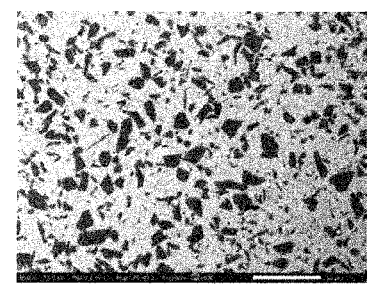
Figure 1B:
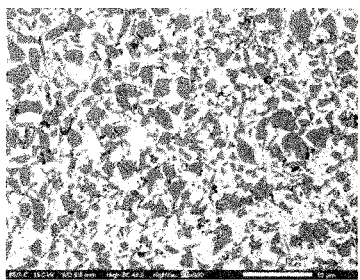
Figure 1F:
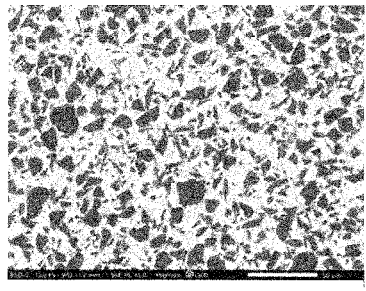
Figure 1J:
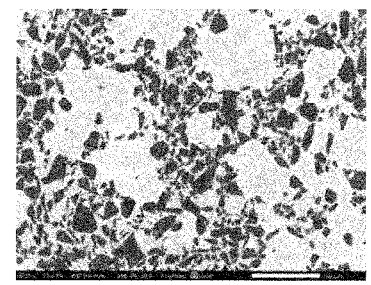
Figure 1C:
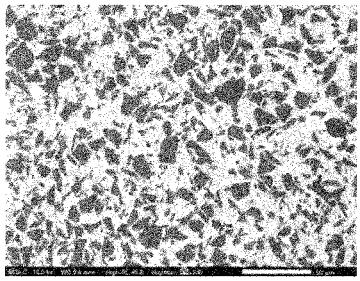
Figure 1G:
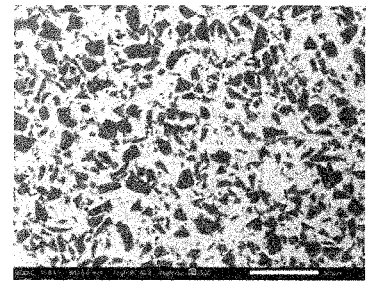
Figure 1K:
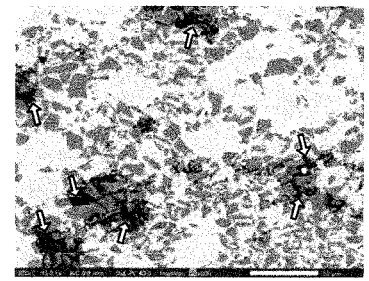
Figure 1D:
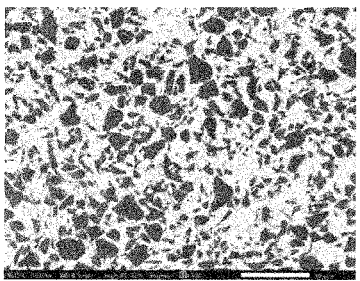
Figure 1H:
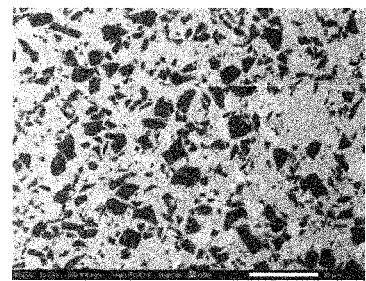

An SEM examination of the dense composite material was conducted. In the SEM examination, a cross section of the dense composite material was mirror-polished, and a backscattered electron image of the cross section was examined with an electron microscope (the SEM used was a JSM-IT500LA, manufactured by JEOL Ltd.). The examination of the backscattered electron image was performed under the conditions including an acceleration voltage of 10 to 15 kV and a PC of 30 to 45. The SEM image (at a magnification of 500×) of each of the experimental examples is shown in FIGS. 1A to 1K.

(7) Average, Standard Deviation, and Maximum Value of Interparticle Distances of Silicon Carbide Interparticle distances of silicon carbide were determined by performing image analysis on the SEM images shown in FIGS. 1A to 1K by using image analysis software, Image-Pro ver. 9.3.2, manufactured by Nippon Roper K.K. Specifically, five parallel straight lines were arranged in the SEM image. A width of each of the straight lines was 0.2 μm. Each of the pixels of the SEM image corresponded to 0.2 μm×0.2 μm. Next, on the straight lines, an area of a region overlapping the light portion (i.e., the Ti—Si matrix) (hereinafter, the region is referred to as a "light region") was automatically calculated. In this instance, each of the straight lines was disposed on the boundary between pixel rows, and, therefore, in the calculation of the area of the light region, regions having a width of 0.4 μm (i.e., a region having a width corresponding to two pixels) were extracted in association with the straight line. The straight line having a width of 0.2 μm was disposed on the boundary between two pixel rows that were adjacent in the width direction (i.e., a plurality of pixel rows arranged in a direction perpendicular to the width direction), and all of the pixels overlapping the straight line were associated with the calculation of the area. In the calculation of the area of the light region, regions corresponding to less than or equal to one pixel (i.e., less than or equal to 0.04 µm²) were not counted, and, therefore, regions of less than 0.05 µm² were ignored as noise. The area of the matrix between particles of silicon carbide was determined as the area of the light region. The area of the matrix is the product of the interparticle distance of silicon carbide and the width of the straight line extracted as the light region (i.e., a width of 0.4 µm). Accordingly, the interparticle distance of silicon carbide was calculated by dividing the area of the light region by 0.4 µm. By using all of the calculated interparticle distances, the average, standard deviation, and maximum value of the interparticle distances were determined.

5. Results

In the dense composite materials of Experimental Examples 1 to 9, the maximum value of the interparticle distances of silicon carbide was less than or equal to 40 µm (specifically, 20 to 40 µm), and the standard deviation was less than or equal to 10 (specifically, 4 to 8). Furthermore, the average of the interparticle distances of silicon carbide was 4 to 10 µm (specifically, 4 to 9 µm). In these dense composite materials, the open porosity was less than or equal to 1%, which indicates that sufficient densification was achieved; the four-point flexural strength was greater than or equal to 250 MPa, which indicates that sufficiently high strength was achieved; the thermal conductivity was greater than or equal to 70 W/mK, which indicates that good thermal conductivity was achieved; and the coefficient of linear thermal expansion was 7.2 to 8.2 ppm/K, which indicates that a coefficient of linear thermal expansion substantially equal to that of alumina (a coefficient of linear thermal expansion different from that of alumina by the absolute value of 0.5 ppm/K or less) was achieved.

On the other hand, in the dense composite material of Experimental Example 10, the maximum value of the interparticle distances of silicon carbide was 59.9 µm, the standard deviation thereof was 11.6, and the average thereof was 8.3 µm; however, properties (the open porosity, four-point flexural strength, thermal conductivity, and coefficient of linear thermal expansion) comparable to those of Experimental Examples 1 to 9 were obtained. It is believed that a reason for this is that the dense composite material had a relatively high content of titanium silicon carbide of 13.1 mass %. That is, in the dense composite material of Experimental Example 10, the interparticle distances of silicon carbide were large and significantly varied, which raised a concern that strength, in particular, may be degraded; however, it is believed that as a result of distribution of titanium silicon carbide, which has high strength, between the silicon carbide particles, good properties were obtained. However, since titanium silicon carbide is a constituent formed in a sintering step, the amount of formation and the distribution of titanium silicon carbide may vary in different lots, and, therefore, good properties may not be consistently obtained. For example, in Experimental Example 11, the raw material components and the blending ratio were the same as those of Experimental Example 10, whereas the firing temperature was changed from 1400° C., which was the firing temperature of Experimental Example 10, to 1370° C. As a result, the open porosity was 4.14%, which was a high value, and the strength was only 239 MPa. In the SEM image of Experimental Example 11 (FIG. 1K), it is apparent that dark black spots were formed in some portions (portions indicated by the arrows). The dark black spots are sintering defect portions (pores). In contrast, regarding Experimental Examples 1 to 9, it is believed that since the microstructure of the dense composite materials was improved (i.e., the interparticle distance of silicon carbide was controlled), good properties were obtained even in a case where titanium silicon carbide was not formed, and, therefore, good properties were consistently obtained regardless of the lots.

6. Joined Body

A metal foil and a dense alumina sintered compact were stacked in this order on the sample (diameter: 50 mm, thickness: 8 mm) of the dense composite material obtained in Experimental Example 1. The metal foil was primarily formed of aluminum and had a thickness of 200 µm (a length and a width of the metal foil were equal to those of the sample). The dense alumina compact had a thickness of 5 mm. The resulting stack was placed in a graphite firing mold and fired in a hot press, at a pressure of 100 kgf/cm² at 600° C. under vacuum. Consequently, a joined body (metallic-bonded joined body) free of separations and voids at the interface was obtained. Furthermore, other joined bodies were similarly produced by using the samples of the dense composite materials obtained in Experimental Example 2 and Experimental Example 9 instead of the sample of the dense composite material obtained in Experimental Example 1. In both cases, no separations or voids were observed at the interface.

The application claims priority to Japanese Patent Application No. 2020-012343 filed in the Japan Patent Office on Jan. 29, 2020, the entire contents of which are incorporated herein by reference.

What is claimed is:

1. A dense composite material comprising:
   titanium silicide in an amount of 43 to 63 mass %;
   silicon carbide in an amount less than the mass percentage of the titanium silicide; and
   titanium carbide in an amount less than the mass percentage of the titanium silicide, wherein
   a maximum value of interparticle distances of the silicon carbide is 40 µm or less, a standard deviation of the interparticle distances is 10 or less, and an open porosity of the dense composite material is 1% or less.

2. The dense composite material according to claim 1, wherein the silicon carbide is present in an amount of 29 to 46 mass %, and the titanium carbide is present in an amount of 5 to 15 mass %.

3. The dense composite material according to claim 1, wherein an average of the interparticle distances of the silicon carbide is 4 to 10 µm.

4. The dense composite material according to claim 1, wherein an average coefficient of linear thermal expansion over a range of 40 to 570° C. of the dense composite material is different from an average coefficient of linear thermal expansion over a range of 40 to 570° C. of alumina by an absolute value of 0.5 ppm/K or less.

5. The dense composite material according to claim 1, wherein the dense composite material has a thermal conductivity of 70 W/mK or greater.

6. The dense composite material according to claim 1, wherein the dense composite material has a four-point flexural strength of 250 MPa or greater.

7. The dense composite material according to claim 1, further comprising titanium silicon carbide.

8. A joined body in which a first member and a second member are joined together, the first member comprising the dense composite material according to claim 1, the second member comprising alumina.

9. The joined body according to claim 8, wherein the first member and the second member are metallic-bonded to each other.

10. A member for a semiconductor manufacturing device, the member comprising the joined body according to claim 8.

11. A method for producing a dense composite material according to claim 1, the method comprising the steps of:
(a) preparing a powder mixture, the powder mixture including silicon carbide in an amount of 24 to 45 mass % and titanium silicide in an amount of 42 to 67 mass %, the silicon carbide having an average particle diameter of 10 to 25 μm, the titanium silicide having an average particle diameter of less than 10 μm, the powder mixture further including titanium metal having an average particle diameter of less than 20 μm or titanium carbide having an average particle diameter of less than 10 μm; and
(b) sintering the powder mixture in a hot press at a temperature of 1350 to 1430° C. in an inert atmosphere.

12. The method for producing a dense composite material according to claim 11, wherein, in the step (a), a mass ratio Si/(Si+Ti) for Si and Ti derived from raw materials of the powder mixture excluding the silicon carbide is 0.40 to 0.50.

* * * * *